(12) United States Patent
Liu et al.

(10) Patent No.: US 9,767,957 B2
(45) Date of Patent: Sep. 19, 2017

(54) METHOD OF MANUFACTURING A TUNABLE THREE DIMENSIONAL INDUCTOR

(71) Applicant: Taiwan Semiconductor Manufacturing Co., Ltd., Hsin-Chu (TW)

(72) Inventors: Monsen Liu, Zhudong Township (TW); Chung-Hao Tsai, Huatan Township (TW); En-Hsiang Yeh, Hsin-Chu (TW); Chuei-Tang Wang, Taichung (TW); Chen-Hua Yu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 207 days.

(21) Appl. No.: 13/964,539

(22) Filed: Aug. 12, 2013

(65) Prior Publication Data
US 2015/0042438 A1 Feb. 12, 2015

(51) Int. Cl.
*H01F 41/04* (2006.01)
*H01F 27/28* (2006.01)
(Continued)

(52) U.S. Cl.
CPC ......... *H01F 41/04* (2013.01); *H01F 17/0006* (2013.01); *H01F 27/2804* (2013.01); *H01F 41/042* (2013.01); *H01F 41/043* (2013.01); *H01F 41/045* (2013.01); *H01F 41/046* (2013.01); *H01L 23/50* (2013.01); *H01L 23/5227* (2013.01); *H01L 23/645* (2013.01);
*H01L 24/29* (2013.01); *H01L 28/10* (2013.01); *H01R 24/40* (2013.01); *H01R 24/48* (2013.01);
(Continued)

(58) Field of Classification Search
CPC ... H01L 23/5227; H01L 23/645; H01L 24/29; H01L 28/10; H01L 23/50; H01F 41/04; H01F 41/045; H01F 17/0006; H01F 27/2804; H01F 2027/2814; H01F 41/042; H01F 41/043; H01F 41/046; Y10T 29/4902; Y10T 29/49073; Y10T 29/49158; Y10T 29/49165; Y10T 29/49169; H01R 24/40; H01R 24/48; H01R 24/56; H01R 43/26
See application file for complete search history.

(56) References Cited

U.S. PATENT DOCUMENTS 4,870,751 A * 10/1989 Antoon ............ Y10T 29/49165
5,164,683 A * 11/1992 Shields ................... H01L 24/49
(Continued)

FOREIGN PATENT DOCUMENTS

JP         2011151367 A * 8/2011

*Primary Examiner* — A. Dexter Tugbang
(74) *Attorney, Agent, or Firm* — Duane Morris LLP

(57) ABSTRACT

A method making a three-dimensional inductor, the method including: forming a plurality of vias in a substrate or a molding compound, wherein the vias are arranged with spacings among them; forming a metal layer having interconnects, wherein the interconnects of the metal layer connect the plurality of vias on one end of the vias; forming a plurality of wires to connect the plurality of vias on the other end of the vias to form the 3D inductor; and tuning one or more of the plurality of wires to adjust a physical configuration and inductance value of the 3D inductor.

17 Claims, 11 Drawing Sheets

(51) Int. Cl.
  *H01L 23/64* (2006.01)
  *H01L 23/522* (2006.01)
  *H01L 49/02* (2006.01)
  *H01L 23/00* (2006.01)
  *H01R 43/26* (2006.01)
  *H01R 24/56* (2011.01)
  *H01R 24/48* (2011.01)
  *H01R 24/40* (2011.01)
  *H01L 23/50* (2006.01)
  *H01F 17/00* (2006.01)

(52) U.S. Cl.
  CPC ............ *H01R 24/56* (2013.01); *H01R 43/26* (2013.01); *H01F 2027/2814* (2013.01); *Y10T 29/4902* (2015.01); *Y10T 29/49073* (2015.01); *Y10T 29/49158* (2015.01); *Y10T 29/49165* (2015.01); *Y10T 29/49169* (2015.01)

(56) References Cited

U.S. PATENT DOCUMENTS

| | | | | |
|---|---|---|---|---|
| 5,576,680 | A * | 11/1996 | Ling | H01F 41/046 257/E21.022 |
| 2002/0172025 | A1* | 11/2002 | Megahed et al. | H01L 23/645 |
| 2007/0097583 | A1* | 5/2007 | Harwath | H01R 24/48 361/118 |
| 2008/0150663 | A1* | 6/2008 | Yeh | H01F 17/0006 336/83 |
| 2008/0252407 | A1* | 10/2008 | Anderson | H01F 41/046 336/177 |
| 2009/0039999 | A1* | 2/2009 | Fujii | H01F 17/0006 336/200 |
| 2009/0168387 | A1* | 7/2009 | Leipold et al. | H01L 23/645 |
| 2011/0284989 | A1* | 11/2011 | Umeno | H01L 23/50 257/531 |

* cited by examiner

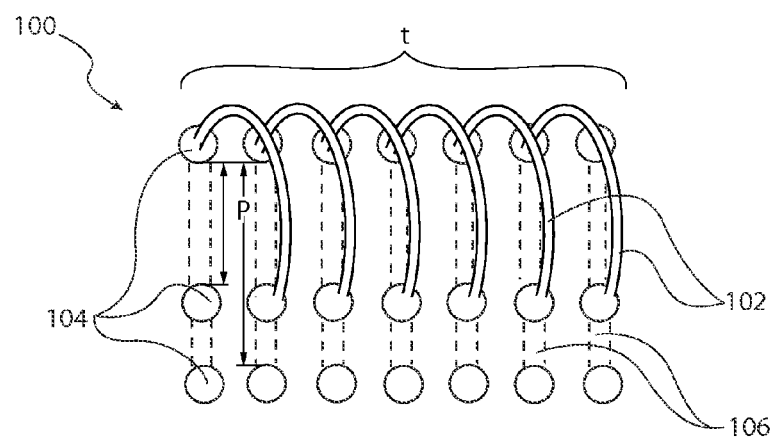
FIG. 1A
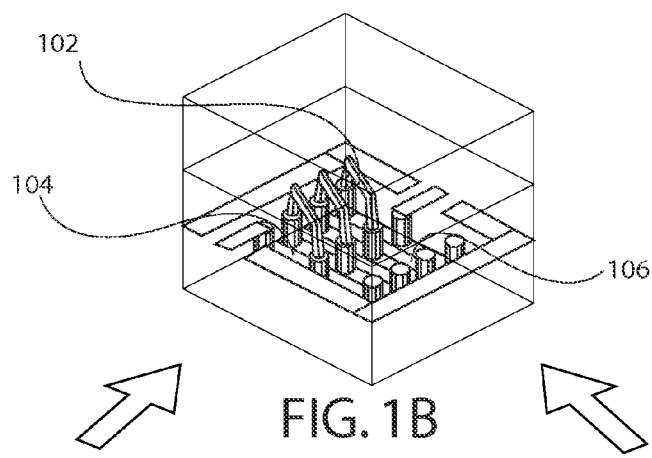
FIG. 1B
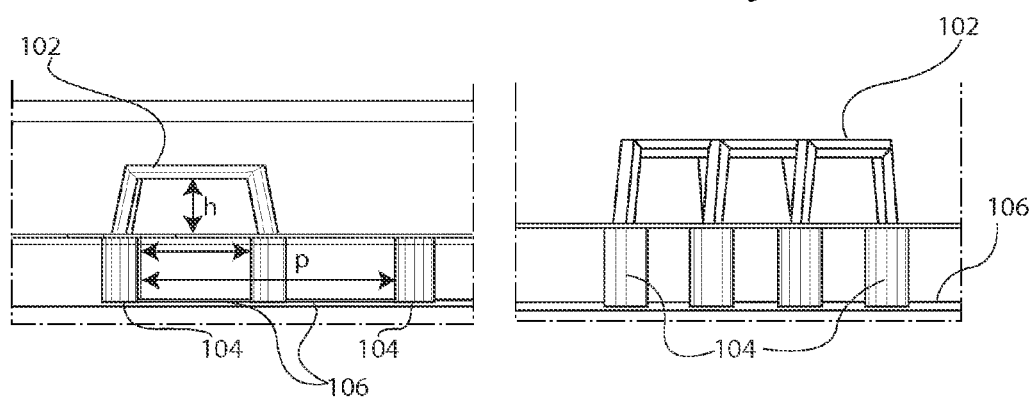
FIG. 1C
FIG. 1D

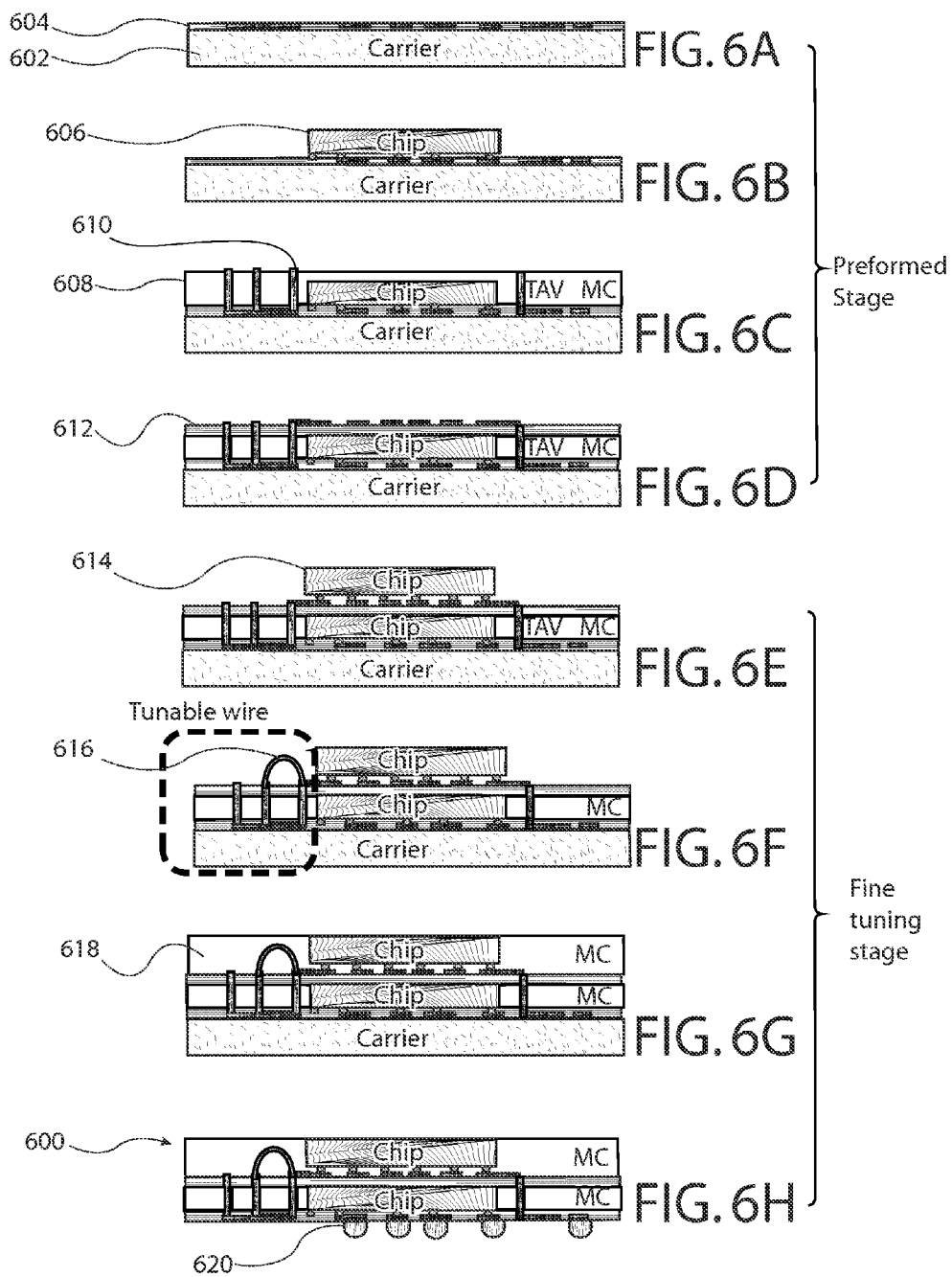

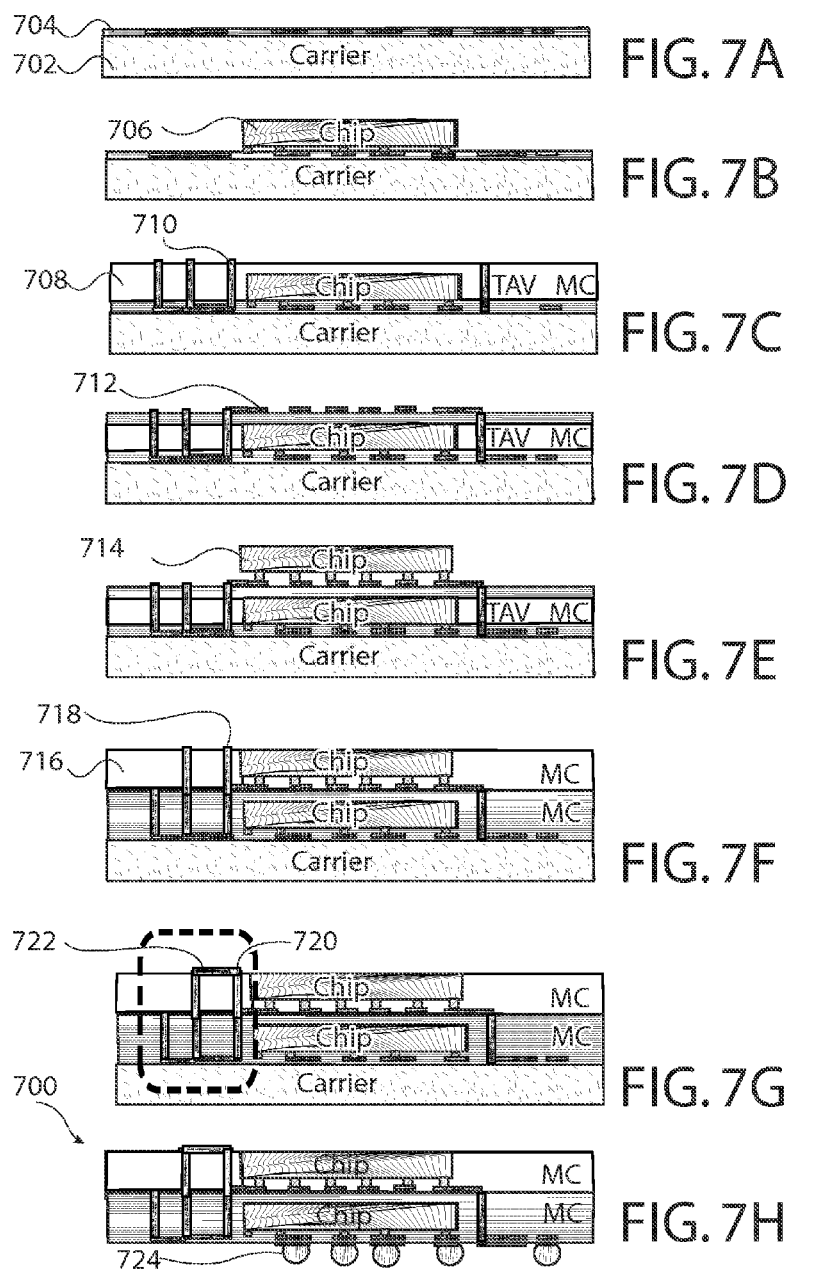

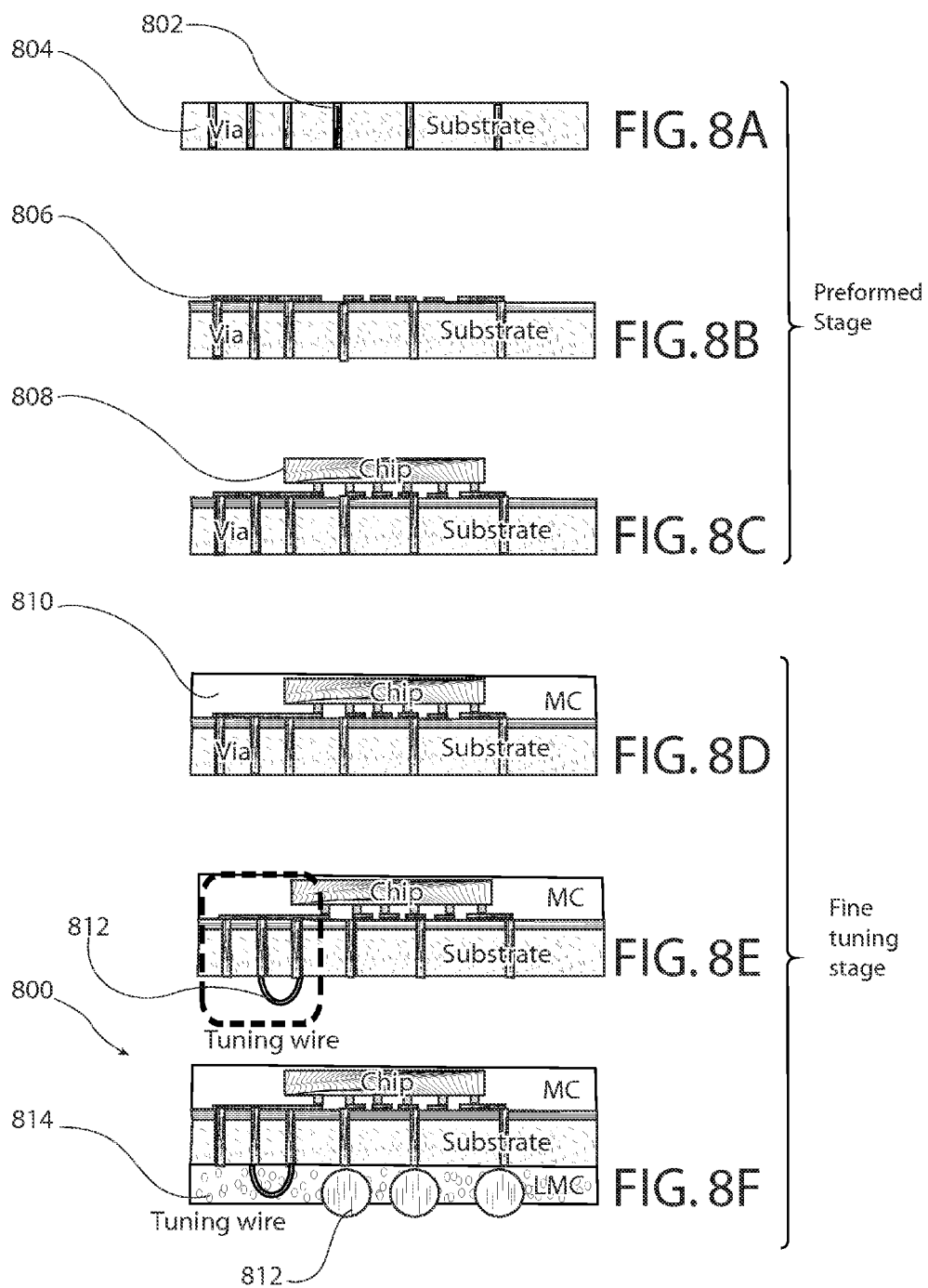

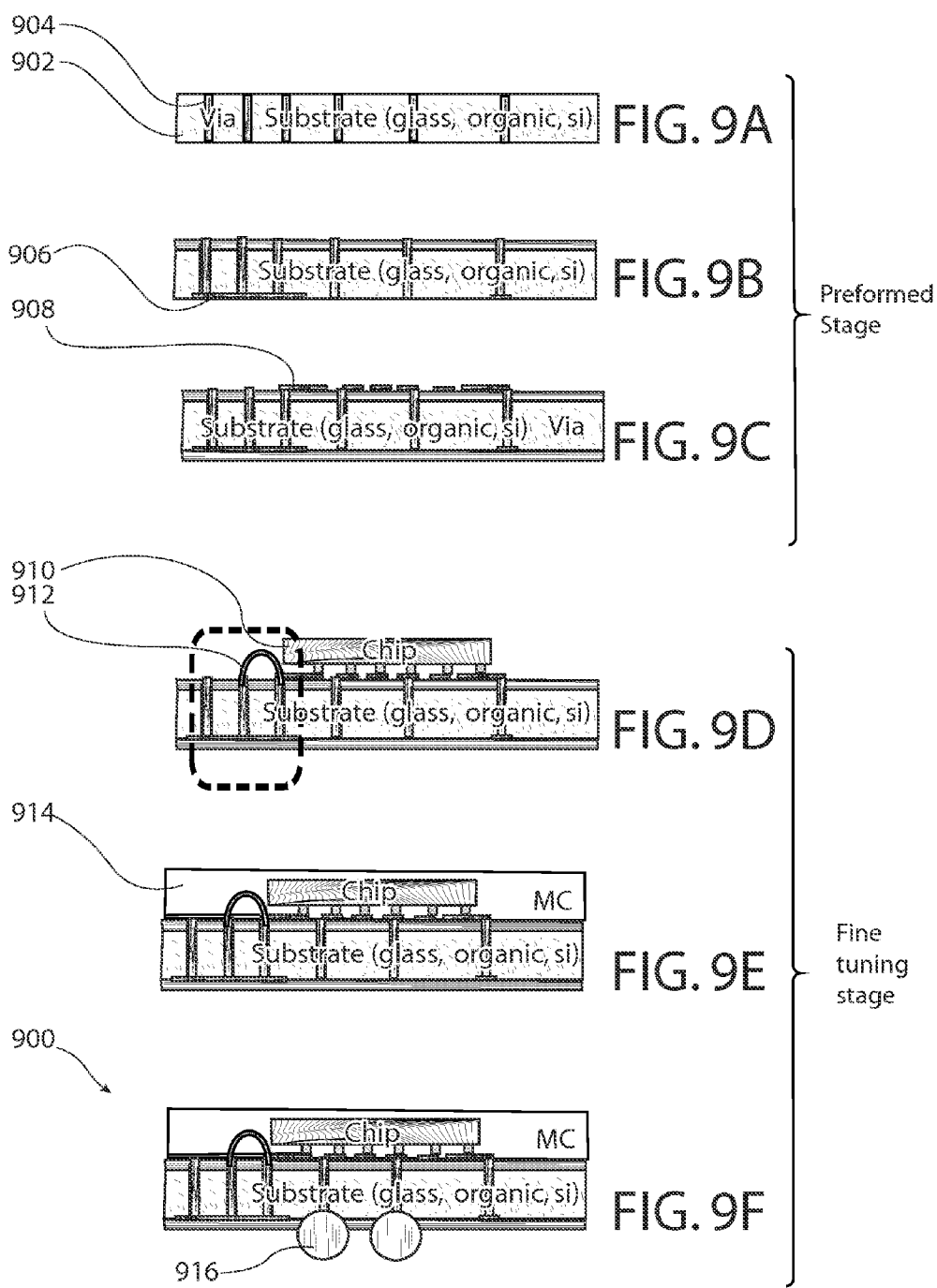

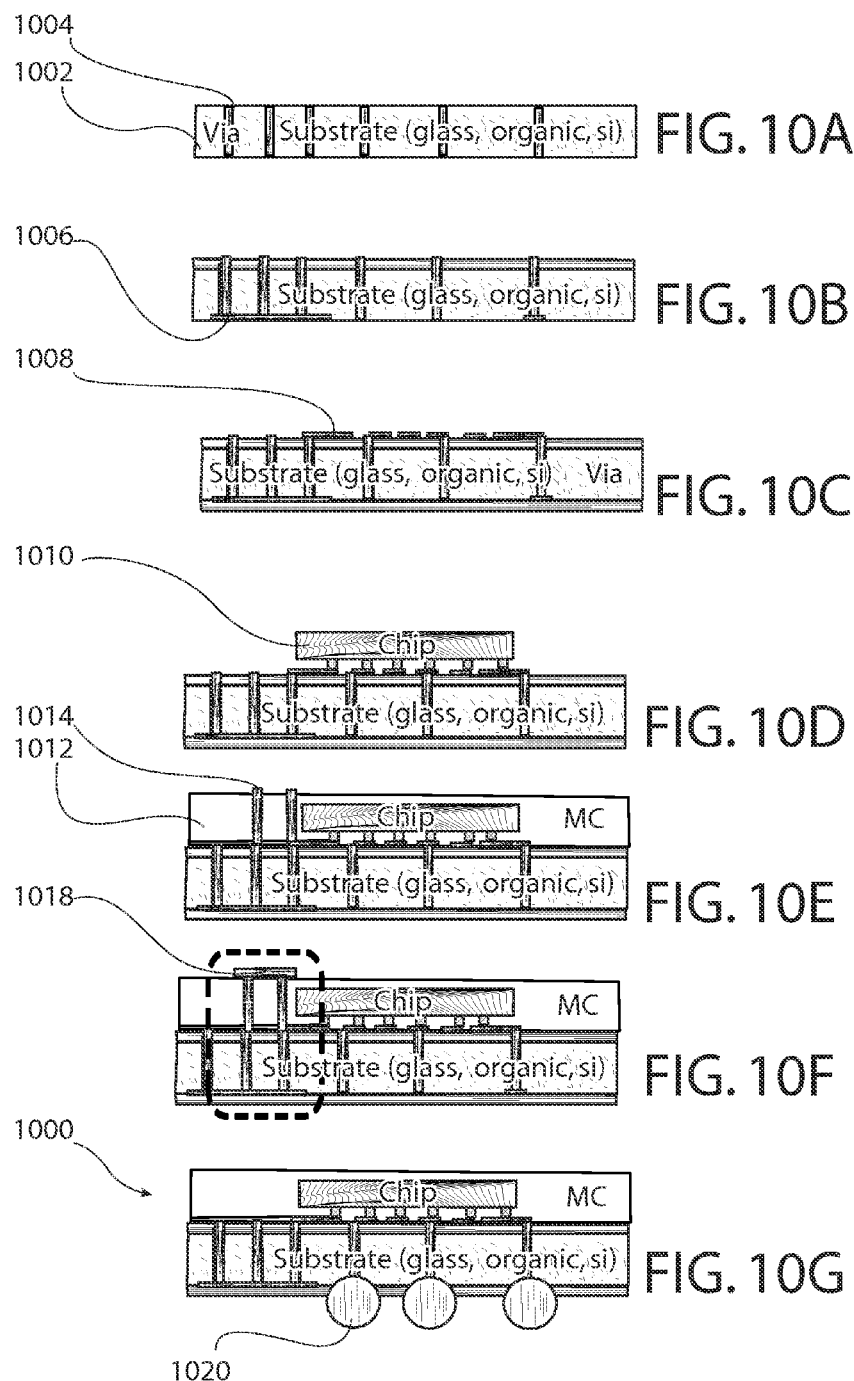

METHOD OF MANUFACTURING A TUNABLE THREE DIMENSIONAL INDUCTOR

FIELD

The disclosed apparatus and method relate to semiconductor integrated circuits ("ICs") and, more particularly, to an inductor that can be used with ICs.

BACKGROUND

Inductors are passive electrical components that are configured to generate a magnetic field that stores energy. Inductors are used in a wide variety of integrated circuit (IC) applications, such as, for example, voltage regulators and many radio frequency (RF) circuits. At least some known inductors can be built directly on integrated circuits using existing integrated chip fabrication processes.

When designing the inductor, it is important to consider the inductance value as well as the quality factor (Q) and occupation area of the inductor. The inductance of an integrated inductor is a measure of the amount of energy stored in an inductor. The Q factor is a ratio of the amount of energy stored in an inductor to the amount of energy dissipated in the inductor, and is a measure of its efficiency. An ideal inductor has a relatively high Q factor. The higher the Q factor of the inductor, the closer it approaches the behavior of an ideal, lossless, inductor.

BRIEF DESCRIPTION OF THE FIGURES

FIGS. 1A-D show a schematic view, an isometric view, a front view, and a side view of an example of a tunable 3D inductor, respectively in accordance with some embodiments.

FIGS. 6A-6H show an example of a manufacturing process of a package having two chips and the tunable 3D inductor with tunable wires packaged together in accordance with some embodiments.

FIGS. 7A-7H show an example of a manufacturing process of a package having two chips and the tunable 3D inductor with tunable wires packaged together in accordance with some embodiments.

FIGS. 8A-8F show another example of a manufacturing process of a package having one chip and the tunable 3D inductor with tunable wires packaged together in accordance with some embodiments.

FIGS. 9A-9F show another example of a manufacturing process of a package having one chip and the tunable 3D inductor with tunable wires packaged together in accordance with some embodiments.

FIGS. 10A-10G show another example of a manufacturing process of a package having one chip and the tunable 3D inductor with tunable wires packaged together in accordance with some embodiments.

DETAILED DESCRIPTION

Figure 2A:
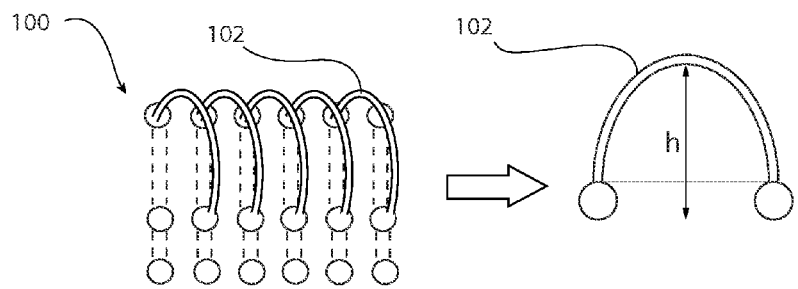
FIG. 2A illustrates an schematic view of the tunable 3D inductor where height h of the wires of the inductor is tunable in accordance with some embodiments.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus, assembly, and/or system be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

This description of the exemplary embodiments is intended to be read in connection with the accompanying drawings, which are to be considered part of the entire written description. The drawings are not drawn to scale. In the various drawings, like reference numerals indicate like items, unless expressly indicated otherwise in the text.

Conventional two-dimensional (2D) and three-dimensional (3D) inductors are fabricated using pre-designed masks to form a redistribution layer (RDL) of interconnects and via connections of the inductors, where the redistribution layer is an extra metal layer on an IC chip that can be used to connects the vias of the inductors. Since they are made using pre-designed masks that are not adjustable during the manufacturing process, the inductance values of the conventional inductors are fixed and not fine tunable or changeable during the manufacturing process.

The inventors have discovered embodiments and methods for a tunable three-dimensional (3D) inductor that can be packaged with one or more chips in an on-chip package, wherein the configuration and inductance value of the 3D inductor are adjustable during the manufacturing process of the inductor. Specifically, the tunable 3D inductor includes a plurality of tunable wires, vias, and metal interconnects in a three-dimensional structure in the same package of one or more IC chips to which the inductor connects. In some embodiments, the inductance value of the 3D inductor is tuned by adjusting one or more of heights, pitches, and turns of wires of the inductor. By tuning various physical parameters and the extra space provided by the three-dimensional configuration, the 3D inductor achieves an adjustable (increased) inductance value and high Q factor with small occupation area on the package with the chips.

FIG. 1A shows a schematic view of an example of tunable 3D inductor 100. FIGS. 1B, 1C, and 1D show an isometric view, front view, and side view of the 3D tunable inductor 100 in FIG. 1A, respectively. As shown in FIGS. 1A-D, tunable 3D inductor 100 includes a plurality of tunable wires 102, each of which connects on one end to a pair of a plurality of vias 104 arranged with certain spacing among them. The plurality of vias 104 are connected to each other at another end through interconnects 106 in a metal layer (e.g., a redistribution layer (RDL), which is an extra metal layer on an IC chip, carrier, interposer or fan-out wafer that can be used to connect the vias of the inductors) to form a functional 3D inductor 100. In some embodiments, wires 102, vias 104, and interconnects 106 are made of conductive materials. In some embodiments, wires 102 and vias 104 are made of thick metal in order to reduce loss and increase Q factor for the 3D inductor. In some embodiments, the physical configuration of the tunable 3D inductor 100 is characterized at least by three parameters—height h of wire 102 as measured by the distance from the top of wire 102 to contact point with via 104, pitch p as measured by the distance along the horizontal or vertical direction between a pair of adjacent or non-adjacent vias 104 connected by the same wire 102, and number of turns t of wires 102 or simply the number of wires 102—in tunable 3D inductor 100. In some embodiments, the physical configuration of 3D inductor 100 is adjusted by independently tuning each of the three parameters of 3D inductor 100, height h, pitch p, and number of wire turns t as discussed in details below, and any adjustment to one of these parameters will affect the inductance value and Q factor of 3D inductor 100.

Figure 2B:
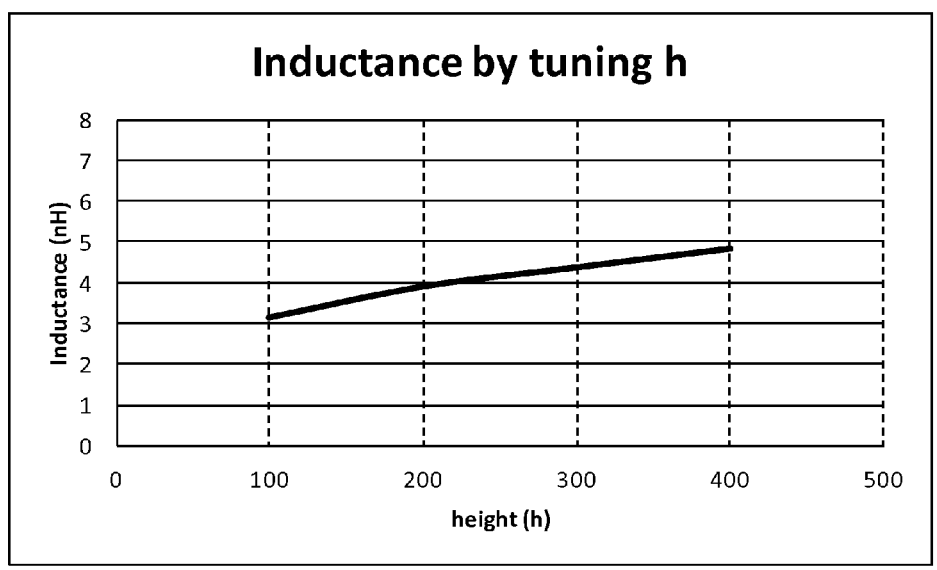
FIG. 2B depicts the relationship between height of the tunable wires and the inductance value of a tunable 3D inductor in accordance with some embodiments.

FIG. 2A illustrates a schematic view of tunable 3D inductor 100 where height h of wires 102 is tunable, e.g., the height of wires 102 is adjustable to tune the inductance value of 3D inductor 100. As shown by the diagram of FIG. 2B depicting the relationship between height h of tunable wires 102 and the inductance value of tunable 3D inductor 100, the inductance value of 3D inductor 100 increases as the height of tunable wires 102 increases. As shown in FIG. 2B, the inductance value of 3D inductor 100 increases from 3 nH to 5 nH as the height of tunable wires 102 increases from 100 μm to 400 μm. Based on the correlation, the inductance value of 3D inductor 100 is increased by tuning and increasing the height of tunable wires 102 of 3D inductor 100. Since the Q factor of an inductor is proportional to its inductance value, the increased inductance value of 3D inductor 100 as a result of the increased height of wires 102 also leads to an increase in the Q factor of 3D inductor 100.

Figure 3A:
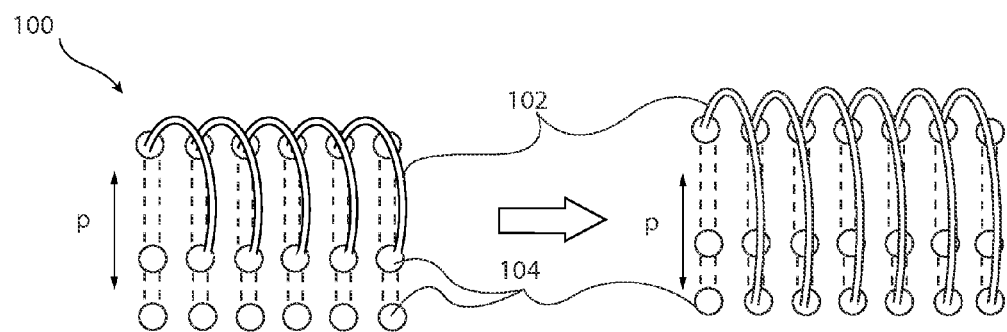
FIG. 3A illustrates a schematic view of a tunable 3D inductor where pitch p of each wire of the inductor is tunable in accordance with some embodiments.
Figure 3B:
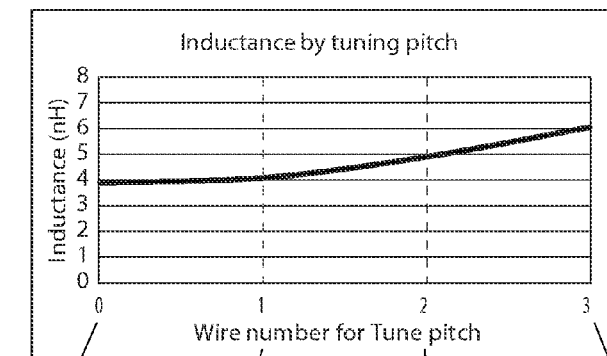
FIG. 3B depicts the relationship between the number of wires which pitch p has been adjusted and the inductance value of the tunable 3D inductor, in accordance with some embodiments.
Figures 3C, 3D, 3E, 3F:
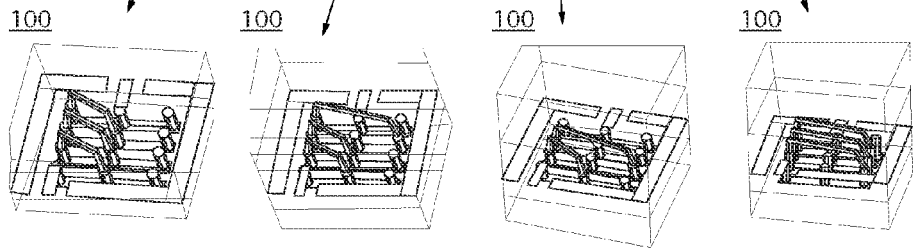
FIGS. 3C-3F show isometric views of the tunable 3D inductor with 0, 1, 2, and 3 wires having pitches tuned, respectively, in accordance with some embodiments.

FIG. 3A illustrates an schematic view of tunable 3D inductor 100 where pitch p of each wire 102 is tunable, e.g., the distance along the horizontal or vertical direction between the two connection points of each wire 102 to vias 104 is adjustable to tune the inductance value of 3D inductor 100. In some embodiments, tuning or adjusting the pitch of wire 102 means moving at least one connection point of wire 102 from one via 104 to another so that the distance between the two via connection points of wire 102 changes (increases). FIG. 3B depicts the relationship between the number of wires 102 which pitch p has been adjusted (increased) and the inductance value of tunable 3D inductor 100. FIGS. 3C-3F show isometric views of tunable 3D inductor 100 with 0, 1, 2, and 3 wires 102 having pitches tuned/increased, respectively. As shown in FIG. 3B-3F, the inductance value of 3D inductor 100 increases as the number of wires 102 with adjusted pitches increases. In the example of FIG. 3B, the inductance value of 3D inductor 100 increases from 4 nH to 6 nH as the number of wires 102 with adjusted pitches increases from 0 to 3. Based on the correlation, the inductance value (as well as the Q factor) of 3D inductor 100 is increased by tuning/increasing the pitches for one or more of the plurality of tunable wires 102 of 3D inductor 100.

Figure 4A:
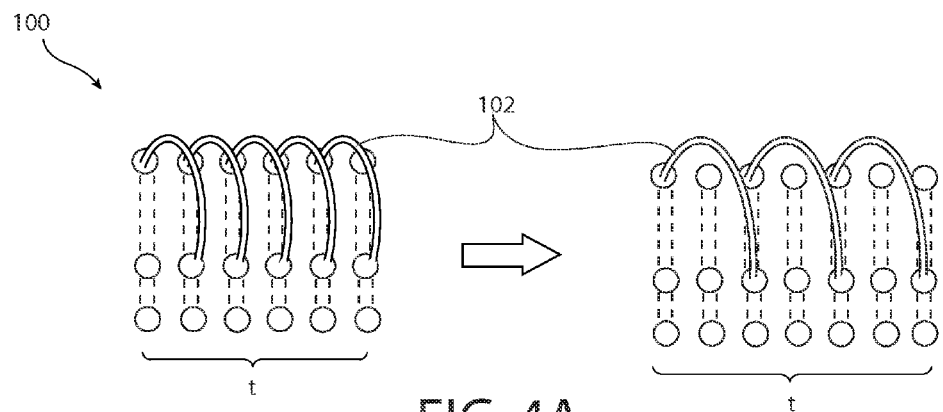
FIG. 4A illustrates a schematic view of a tunable 3D inductor where the number of wires of the inductor is tunable in accordance with some embodiments.
Figure 4B:
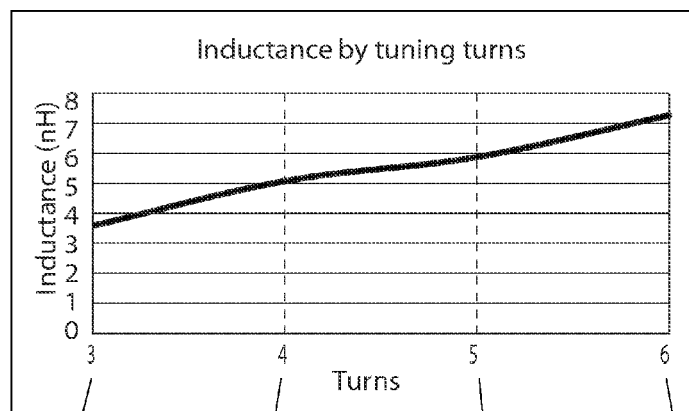
FIG. 4B depicts the relationship between the number of wires 102 and the inductance value of the tunable 3D inductor in accordance with some embodiments.
Figures 4C, 4D, 4E, 4F:
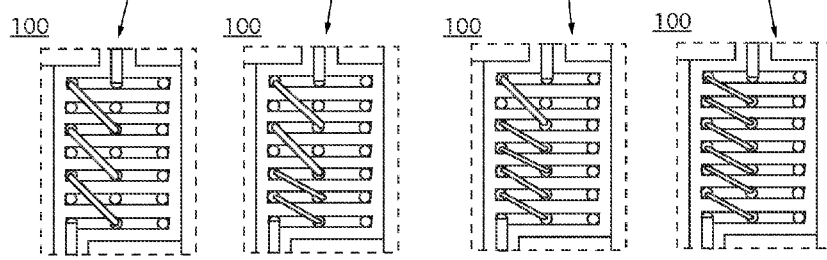
FIGS. 4C-4F show isometric views of the tunable 3D inductor having 3, 4, 5, and 6 number of wires (or turns), respectively in accordance with some embodiments.

FIG. 4A illustrates a schematic view of tunable 3D inductor 100 where the number of turns t, or simply the number of wires 102 is tunable, e.g., the number of wires 102 is adjustable (increased or decreased) to tune the inductance value of 3D inductor 100. FIG. 4B depicts the relationship between the number of wires 102 and the inductance value of tunable 3D inductor 100. FIGS. 4C-4F show isometric views of tunable 3D inductor 100 having 3, 4, 5, and 6 number of wires 102 (or turns), respectively. As shown in FIG. 4B, the inductance value of 3D inductor 100 increases as the number of wires 102 increases. In the example of FIG. 4B, the inductance value of 3D inductor 100 increases from less than 4 nH to over 7 nH as the number of wires 102 increases from 3 to 6. Based on the correlation, the inductance value (as well as the Q factor) of 3D inductor 100 is increased by tuning/increasing the number of wires 102 of 3D inductor 100.

Figure 5A:
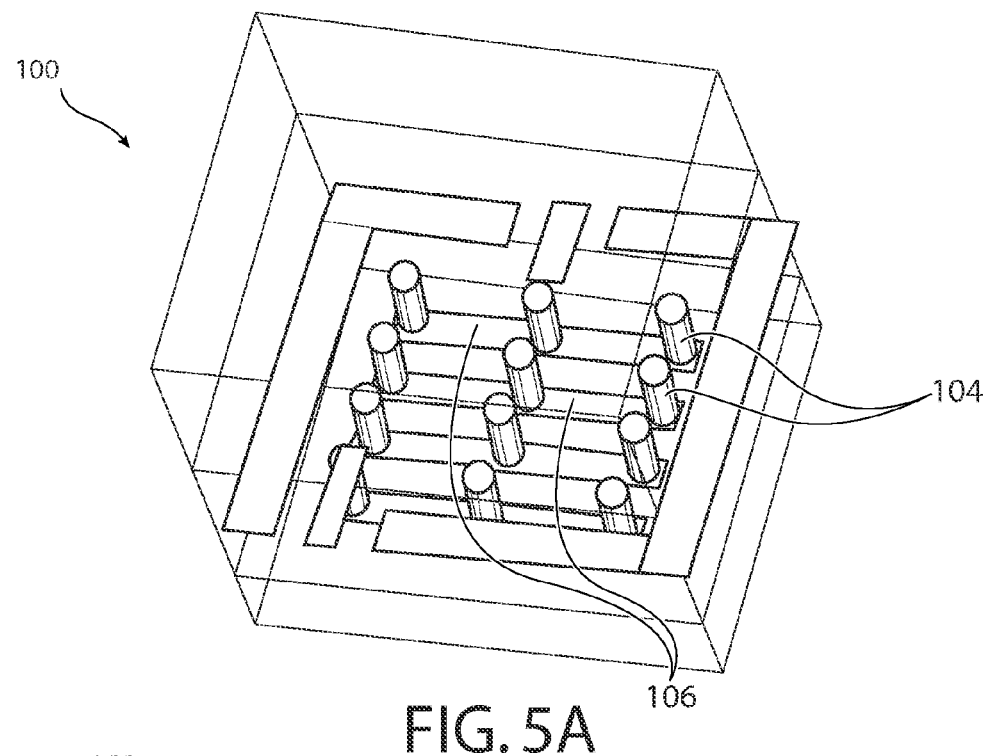
FIGS. 5A-B show isometric views of a tunable 3D inductor before and after the hybrid tuning approach has been applied to the 3D inductor, respectively in accordance with some embodiments.
Figure 5B:
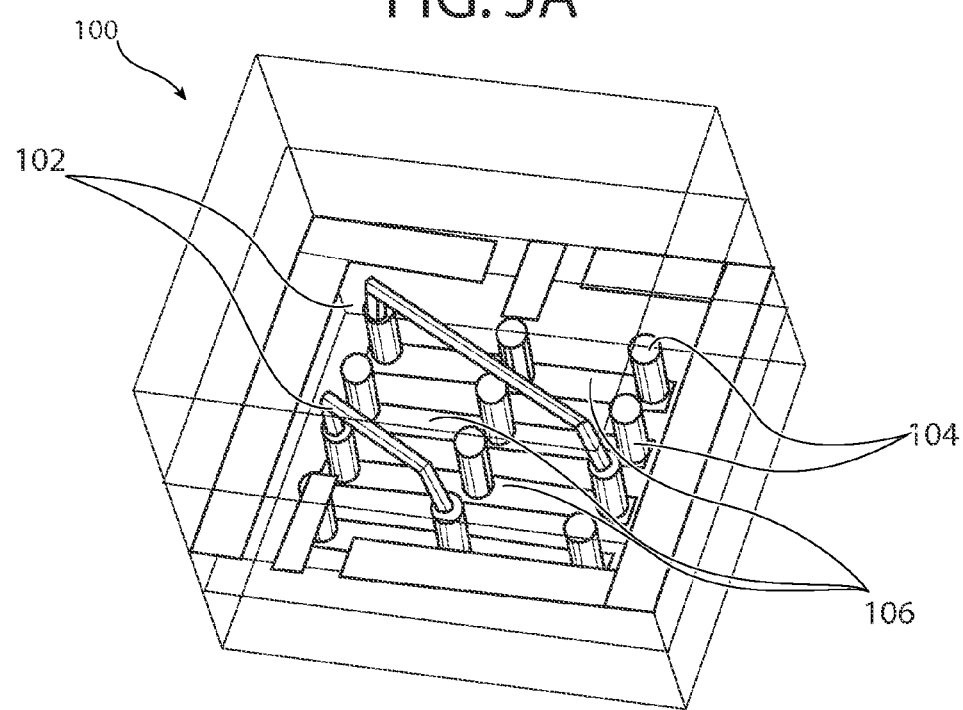

In some embodiments, wires 102 of tunable 3D inductor 100 are adjusted using a hybrid tuning approach, which utilizes more than one of the wire tuning methods described above. For example, in some embodiments, a hybrid tuning approach tunes one or more of the height h, pitch p, and turns t of wires 102 of the inductor. FIG. 5A-B show isometric views of tunable 3D inductor 100 before and after the hybrid tuning approach has been applied to 3D inductor 100, respectively. In the example of FIG. 5B, both the pitches as well as the number (or turns) of wires 102 are adjusted in order to increase the inductance value as well as Q factor of 3D inductor 100.

In some embodiments, the manufacturing process of a package that includes both one or more chips and tunable 3D inductor 100 is divided into two stages—the preformed stage, during which the fixed or untunable portion of the 3D inductor is formed, and the fine tuning stage, during which the tunable portion of the 3D inductor is formed. FIGS. 6A-6H show an example of a manufacturing process of package 600 having two chips and a tunable 3D inductor with tunable wires packaged together. More particularly, FIGS. 6A-6D illustrate the manufacturing steps during the preformed stage, and FIGS. 6E-6H illustrate the manufacturing steps during the fine tuning stage. As shown in FIG. 6A, a bottom redistribution layer 604 of metal interconnections is formed on top of carrier 602. A bottom chip 606 is placed on top of the bottom redistribution layer 604 as shown in FIG. 6B. In some embodiments, the bottom chip 606 is sealed within molding compound (MC) 608 and a plurality of through assembly vias (TAV) 610 (104 of inductor 100) are formed within MC 608 and connected with each other via—redistribution layer 604 as shown in FIG. 6C. A top redistribution layer 612 is formed on the top surface of MC 608 as shown in FIG. 6D. As shown in FIG. 6E, top chip 614 is placed (for example, via bumping) on top of top redistribution layer 612. Wires 616 (102 of inductor 100) of 3D inductor 100 are connected to TAVs 610 to form the inductor and are fine-tuned using one or more of the methods discussed above to adjust the inductance value of inductor 100 as shown in FIG. 6F. Once 3D inductor 100 is formed and tuned, both wires 616 and top chip 614 are sealed within top MC 618 to form package 600 as shown in FIG. 6G. Balls 620 are mounted on the bottom of package 600 as shown in FIG. 6H.

FIGS. 7A-7H show an example of a manufacturing process of package 700 having two chips and a tunable 3D inductor with tunable wires packaged together. As shown in FIG. 7A, a bottom redistribution layer 704 of metal interconnections is formed on top of carrier 702. A bottom chip 706 is placed on top of the bottom redistribution layer 704 as shown in FIG. 7B. In some embodiments, the bottom chip 606 is sealed within molding compound (MC) 708 and a plurality of through assembly vias (TAV) 710 (104 of inductor 100) are formed within MC 708 and connected with each other via redistribution layer 704 as shown in FIG. 7C. A top redistribution layer 712 is formed on the top surface of MC 708 as shown in FIG. 7D. As shown in FIG. 7E, top chip 714 is placed (for example, via bumping) on top of top redistribution layer 712. As shown in FIG. 7F, top chip 714 is sealed in top MC 716, which has its height controlled so that vias 718 extended from TAVs 710 and grown within top MC 716 are controlled to a desired height. Once vias 718 are formed in top MC 716 with the controlled height, a final redistribution layer 720 is formed on top of top MC 716 where final redistribution layer 720 includes wires 722 that serve as wires 102 to connect vias 718 to form 3D inductor 100. In some embodiments, the height of vias 718 plus the height of TAV 710 determines the height of wires 722 (102 of inductor 100) in final redistribution layer 720. Consequently, in some embodiments, the height of wires 722 and thus the inductance value of 3D inductor 100 are tuned by controlling the height of top MC 716 during the fine tuning stage of the manufacturing process. Finally, balls 724 are mounted on the bottom of package 700 as shown in FIG. 7H similar to FIG. 6H.

FIGS. 8A-8F show an example of a manufacturing process of package 800 having one chip and a tunable 3D inductor with tunable wires packaged together. Package 800 is formed on substrate 802, which can be glass, organic, or silicon material, and through substrate vias (TSVs) 804 are formed in substrate 802 as shown in FIG. 8A. An redistribution layer 806 is formed on top of substrate 802 to connect TSVs 804 together as shown in FIG. 8B, and chip 808 is placed (e.g., via bumping) on top of redistribution layer 806 as shown in FIG. 8C. Chip 808 is sealed within molding compound (MC) 810 as shown in FIG. 8D. Wires 812 (102 of inductor 100) are connected to TSVs 804 at the bottom of the vias instead at the top of these vias to form inductor 100 as shown in FIG. 8E. In some embodiments, wires 812 are fine-tuned using one or more of the methods discussed above to adjust the inductance value of inductor 100. Once 3D inductor 100 is formed and tuned, wires 812 are sealed within liquid molding compound (LMC) 814 at the bottom of glass substrate 802 with balls 816 mounted on the bottom to form package 800 as shown in FIG. 8F.

FIGS. 9A-9F show an example of a manufacturing process of package 900 having one chip and a tunable 3D inductor with tunable wires packaged together. Package 900 is formed on substrate 902, which can be glass, organic, or silicon material, and vias 904 are formed in substrate 902 as shown in FIG. 9A. A bottom redistribution layer 906 and a top redistribution layer 908 are formed on the bottom and the top of substrate 902 to connect vias 904 together as shown in FIGS. 9B and 9C, respectively. As shown in FIG. 9D, chip 910 is placed (e.g., via bumping) on top of redistribution layer 908, and wires 912 (102 of inductor 100) are connected to vias 904 at the top of these vias to form the 3D inductor. In some embodiments, wires 912 are fine-tuned by one or more of the methods discussed above to adjust the inductance value of inductor 100. Chip 910 and the tuned wires 912 are then sealed within molding compound (MC) 914 as shown in FIG. 9E. Balls 916 are mounted on the bottom of bottom redistribution layer 906 to form package 900 as shown in FIG. 9F.

FIGS. 10A-10G show an example of a manufacturing process of package 1000 having one chip and tunable 3D inductor with tunable wires packaged together. Package 1000 is formed on substrate 1002, which can be glass, organic, or silicon material, and vias 1004 are formed in substrate 1002 as shown in FIG. 10A. A bottom redistribution layer 1006 and a top redistribution layer 1008 are formed on the bottom and the top of substrate 1002 to connect vias 1004 together as shown in FIGS. 10B and 10C, respectively. As shown in FIG. 10D, chip 1010 is placed (e.g., via bumping) on top of redistribution layer 1008. As shown in FIG. 10E, chip 1010 is sealed in MC 1012, which has its height controlled so that vias 1014 extended from vias 1004 and grown within MC 1012 are controlled to a desired height. Once vias 1014 are formed in MC 1012 with the controlled height, a final redistribution layer 1016 is formed on top of MC 1012 where final redistribution layer 1016 includes wires 1018 that serve as wires 102 as described above with respect to FIGS. 1A-5B to connect vias 1014 to form the 3D inductor. In some embodiments, the height of vias 1014 plus the height of vias 1004 determines the height of wires 1018 (102 of inductor 100) in final redistribution layer 1016. Consequently, the height of wires 1018 and thus the inductance value of 3D inductor 100 are tuned by controlling the height of MC 1012 during the fine tuning stage of the manufacturing process. Finally, balls 1020 are mounted on the bottom of package 1000 as shown in FIG. 10G.

Figure 11:
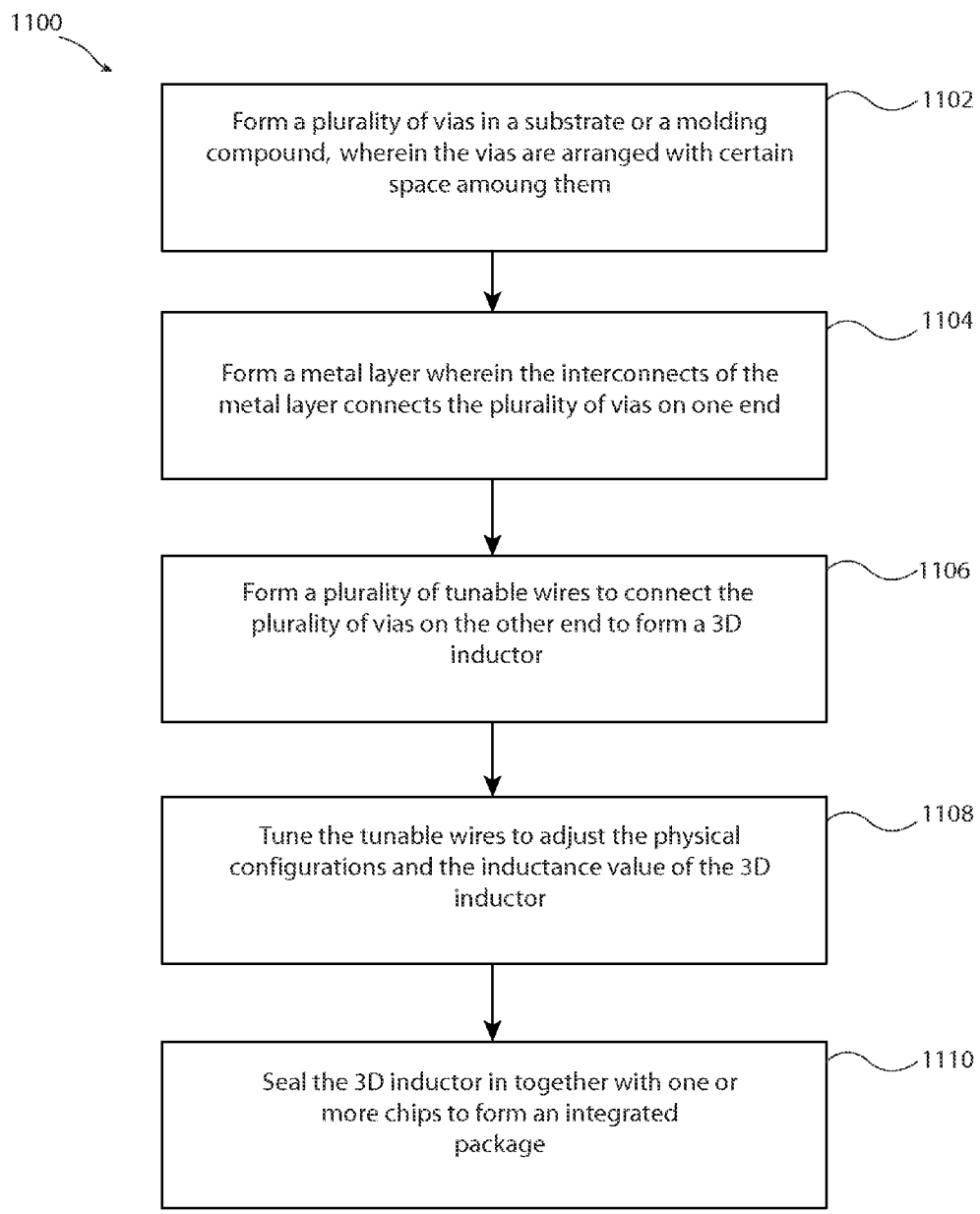
FIG. 11 is a flow chart of a method for forming a tunable 3D inductor wherein one or more of height, pitch, and number of turns of the wires of the tunable 3D inductor are tuned to adjust the inductance value and Q factor of the 3D inductor in accordance with some embodiments.

FIG. 11 is a flow chart 1100 of one example of a method for forming a tunable 3D inductor wherein one or more of height, pitch, and number of the wires of the tunable 3D inductor are tuned to adjust the inductance value and Q factor of the 3D inductor.

At step 1102, a plurality of vias are formed in a substrate or a molding compound, wherein the vias are arranged with certain spacing among them.

At step 1104, an metal layer is formed wherein the interconnects of the metal layer connects the plurality of vias on one end.

At step 1106, a plurality of tunable wires are formed to connect the plurality of vias on the other end to form a 3D inductor.

At step 1108, the tunable wires are tuned to adjust the physical configurations and inductance value of the 3D inductor.

At step 1110, the 3D inductor is sealed together with one or more chips to form an integrated package.

In some embodiments, a method comprises forming a plurality of vias in a substrate or a molding compound, wherein the vias are arranged with spacing among them. The method further comprises forming a metal layer wherein the interconnects of the metal layer connects the plurality of vias on one end of the vias and forming a plurality of wires to connect the plurality of vias on the other end of the vias to form a three-dimensional (3D) inductor. The method also comprises tuning one or more of the plurality wires to adjust the physical configurations and inductance value of the 3D inductor.

In some embodiments, the method further comprises sealing the 3D inductor together with one or more chips to form an integrated package.

In some embodiments, the method further comprises forming the plurality of tunable wires and the plurality of vias with metal.

In some embodiments, the method further comprises forming the metal layer as a redistribution layer (RDL) of interconnects.

In some embodiments, the method further comprises tuning height of the plurality of tunable wires to adjust the inductance of the 3D inductor, wherein the inductance of the 3D inductor increases when the height of the plurality of tunable wires increases.

In some embodiments, the method further comprises tuning pitch of one or more of the plurality of tunable wires to adjust the inductance of the 3D inductor, wherein the inductance of the 3D inductor increases when the number of tunable wires which pitches are tuned increases.

In some embodiments, the method further comprises tuning number or turns of the plurality of tunable wires to adjust the inductance of the 3D inductor, wherein the inductance of the 3D inductor increases when the number or turns of tunable wires increase.

In some embodiments, the method further comprises forming the package in two stages by forming the fixed or untunable portion of the 3D inductor during a preformed stage, and forming the tunable portion of the 3D inductor during a fine tuning stage.

In some embodiments, the method further comprises forming the plurality of vias in a molding compound.

In some embodiments, the method further comprises forming the plurality of vias in a substrate.

In some embodiments, the method further comprises forming the plurality of vias partly in a substrate and partly in a molding compound.

In some embodiments, a method comprises forming a plurality of vias in a substrate or a molding compound, wherein the vias are arranged with spacing among them. The method further comprises forming a metal layer wherein the interconnects of the metal layer connects the plurality of vias on one end of the vias and forming a plurality of wires to connect the plurality of vias on the other end of the vias to form a three-dimensional (3D) inductor. The method also comprises tuning at least two of height, pitches, and number of turns of one or more of the plurality wires to adjust the physical configurations and inductance value of the 3D inductor.

In some embodiments, a tunable three-dimensional (3D) inductor comprises a plurality of vias arranged with at least one spacing among them, a plurality of interconnects in a redistribution layer (RDL), wherein the plurality of interconnects connect to respective ones of the plurality of vias on one end of the vias, and a plurality of wires that connect to the plurality of vias on the other end of the vias to form the 3D inductor, wherein an inductance value of the 3D inductor is based on at least one of a height, pitch, and turn of the plurality of wires.

In some embodiments, the plurality of tunable wires and the plurality of vias are made of metal.

In some embodiments, height of the plurality of wires is tuned to adjust the inductance of the 3D inductor, wherein the inductance of the 3D inductor increases when the height of the plurality of tunable wires increases.

In some embodiments, pitch of one or more of the plurality of tunable wires is tuned to adjust the inductance of the 3D inductor, wherein the inductance of the 3D inductor increases when the number of tunable wires which pitches are tuned increases.

In some embodiments, number or turns of the plurality of tunable wires is tuned to adjust the inductance of the 3D inductor, wherein the inductance of the 3D inductor increases when the number or turns of tunable wires increase.

In some embodiments, the plurality of vias are formed in a molding compound.

In some embodiments, the plurality of vias are formed in a substrate.

In some embodiments, the plurality of vias are formed partly in a molding compound and partly in a substrate.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method, comprising:
   forming a metal layer having interconnects;
   providing a substrate or a molding compound over the metal layer;
   forming a plurality of vias in the substrate or the molding compound, wherein the vias are arranged with spacings among them, and wherein the interconnects of the metal layer connect the plurality of vias on respective first ends of the vias;
   forming a plurality of wires to connect the plurality of vias on respective second ends of the vias wherein a three-dimensional (3D) inductor is formed by at least part of the interconnects, the plurality of vias, and the plurality of wires, and wherein each of the plurality of wires protrudes outwardly from a top surface of the substrate or the molding compound with a spacing disposed between each of the plurality of wires and the top surface of the substrate or the molding compound;
   tuning one or more of the plurality of wires to adjust a physical configuration and inductance value of the 3D inductor.

2. The method of claim 1, further comprising:
   sealing the 3D inductor together with one or more chips to form an integrated package.

3. The method of claim 2, further comprising:
   forming the package in two stages by forming the fixed or untunable portion of the 3D inductor during a preformed stage, and forming the tunable portion of the 3D inductor during a fine tuning stage.

4. The method of claim 1, further comprising:
   forming the plurality of wires and the plurality of vias with metal.

5. The method of claim 1, further comprising:
   forming the metal layer as a redistribution layer (RDL) of interconnects.

6. The method of claim 1, wherein the tuning of the one or more of the plurality of wires further comprises:
   tuning a height of the plurality of wires to adjust the inductance of the 3D inductor, wherein the inductance of the 3D inductor increases when the height of the plurality of wires increases.

7. The method of claim 1, wherein the tuning of the one or more of the plurality of wires further comprises:

tuning a pitch of one or more of the plurality of wires to adjust the inductance of the 3D inductor, wherein the inductance of the 3D inductor increases when the number of wires which pitches are tuned increases.

8. The method of claim 1, wherein the tuning of the one or more of the plurality of wires further comprises:
tuning a number or turns of the plurality of wires to adjust the inductance of the 3D inductor, wherein the inductance of the 3D inductor increases when the number or turns of wires increase.

9. The method of claim 1, further comprising:
forming the plurality of vias in a molding compound.

10. The method of claim 1, further comprising:
providing both the substrate and the molding compound and forming the plurality of vias partly in the substrate and partly in the molding compound.

11. A method, comprising:
forming a metal layer having interconnects;
providing a substrate or a molding compound over the metal layer;
forming a plurality of vias in the substrate or the molding compound, wherein the vias are arranged with spacings among them, and wherein the interconnects of the metal layer connect the plurality of vias on one end of the vias;
forming a plurality of wires to connect the plurality of vias on the other end of the vias wherein a three-dimensional (3D) inductor is formed by at least part of the interconnects, the plurality of vias, and the plurality of wires, and wherein each of the plurality of wires protrudes outwardly from a top surface of the substrate or the molding compound with a spacing disposed between each of the plurality of wires and the top surface of the substrate or the molding compound;
tuning at least one of height, pitch, and number or turns of one or more of the plurality wires to adjust the physical configuration and inductance value of the 3D inductor.

12. The method of claim 11, wherein the tuning of the at least one of height, pitch, and number of turns of the one or more of the plurality of wires further comprises:
tuning a height of the plurality of wires to adjust the inductance of the 3D inductor, wherein the inductance of the 3D inductor increases when the height of the plurality of wires increases.

13. The method of claim 11, wherein the tuning of the at least one of height, pitch, and number of turns of the one or more of the plurality of wires further comprises:
tuning a pitch of one or more of the plurality of wires to adjust the inductance of the 3D inductor, wherein the inductance of the 3D inductor increases when the number of wires which pitches are tuned increases.

14. The method of claim 11, wherein the tuning of the at least one of height, pitch, and number of turns of the one or more of the plurality of wires further comprises:
tuning a number or turns of the plurality of wires to adjust the inductance of the 3D inductor, wherein the inductance of the 3D inductor increases when the number or turns of wires increase.

15. The method of claim 11, further comprising:
providing both the substrate and the molding compound and forming the plurality of vias partly in the substrate and partly in the molding compound.

16. A method, comprising:
forming a metal layer having interconnects;
providing a substrate or a molding compound over the metal layer;
forming a plurality of vias in the substrate or the molding compound, wherein the vias are arranged with spacings among them, and wherein the interconnects of the metal layer connect the plurality of vias on one end of the vias;
forming a plurality of wires to connect the plurality of vias on the other end of the vias wherein a three-dimensional (3D) inductor is formed by at least part of the interconnects, the plurality of vias, and the plurality of wires, and wherein each of the plurality of wires protrudes outwardly from a top surface of the substrate or the molding compound with a spacing disposed between each of the plurality of wires and the top surface of the substrate or the molding compound;
tuning at least one of height, pitch, and number or turns of one or more of the plurality wires to adjust the physical configuration and inductance value of the 3D inductor;
sealing the 3D inductor together with one or more chips to form an integrated package.

17. The method of claim 16, further comprising:
forming the integrated package in two stages by forming the fixed or untunable portion of the 3D inductor during a preformed stage, and forming the tunable portion of the 3D inductor during a fine tuning stage.

* * * * *